(12) United States Patent
Soh

(10) Patent No.: US 6,200,142 B1
(45) Date of Patent: Mar. 13, 2001

(54) ASSEMBLY INCLUDING A FLEX CIRCUIT AND A GAS TIGHT CHAMBER

(75) Inventor: Lip-Teck Soh, Singapore (SG)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/503,367

(22) Filed: Feb. 14, 2000

Related U.S. Application Data
(60) Provisional application No. 60/121,091, filed on Feb. 22, 1999.

(51) Int. Cl.[7] ........................................................ H01R 9/09
(52) U.S. Cl. ................................................................ 439/67
(58) Field of Search .................................. 439/67, 77, 66, 439/591, 495; 360/97.01

(56) References Cited

U.S. PATENT DOCUMENTS

| | | | |
|---|---|---|---|
| 2,749,382 | * 6/1956 | Lockard | 174/71 |
| 4,597,617 | * 7/1986 | Enochs | 339/17 CF |
| 4,881,908 | * 11/1989 | Ferry et al. | 439/161 |
| 4,907,975 | * 3/1990 | Dranchak et al. | 439/67 |
| 5,045,921 | * 9/1991 | Lin et al. | 357/74 |
| 5,206,795 | * 4/1993 | Belanger, Jr. | 361/398 |
| 5,314,342 | * 5/1994 | Figge | 439/66 |
| 5,573,409 | * 11/1996 | Shiley et al. | 439/76.1 |
| 6,097,087 | * 8/2000 | Farnworth et al. | 257/698 |

* cited by examiner

Primary Examiner—Gary Paumen
Assistant Examiner—Phuongchi Nguyen
(74) Attorney, Agent, or Firm—Perman & Green, LLP

(57) ABSTRACT

An assembly which a concave member and a first substrate having a transverse opening which is superimposed over the concave member to form an internal chamber. A second substrate having a transverse opening is also superimposed over said first substrate, and an electrical connector means is mounted on the second substrate. A flex circuit is interposed in spaced generally parallel relation between the first substrate and the concave member. An extension of the flex circuit extends through the transverse openings of the first and second substrate to engage the electrical connector means.

30 Claims, 5 Drawing Sheets

ASSEMBLY INCLUDING A FLEX CIRCUIT AND A GAS TIGHT CHAMBER

This application claims the benefit of U.S. provisional application No. 60/121,091 filed on Feb. 22, 1999.

BACKGROUND OF THE INVENTION

1. Field of the Invention

The present invention relates to flex circuit assemblies and more particularly to assemblies in which flex circuits are used to carry signals into and out of gas-tight chambers.

2. Brief Description of Earlier Developments

Direct access storage devices (DASD), or disk drives, store information on concentric tracks of a rotatable magnetic disk. In such devices flex circuits may extend out of gas tight chambers. Further efficiencies in integrating flex circuit and gas tight chambers are needed.

SUMMARY OF THE INVENTION

The present invention is an assembly in which a concave member and a first substrate having a transverse opening is superimposed over the concave member to form an internal chamber. A second substrate having a transverse opening is also superimposed over said first substrate, and an electrical connector means is mounted on the second substrate. A flex circuit is interposed in spaced relation between the first substrate and the concave member. An extension of the flex circuit projects through the transverse openings of the first and second substrate to engage the electrical connector means.

BRIEF DESCRIPTION OF THE DRAWINGS

The present invention is further described with reference to the accompanying drawings in which.

DESCRIPTION OF THE PREFERRED EMBODIMENTS

Figure 1:
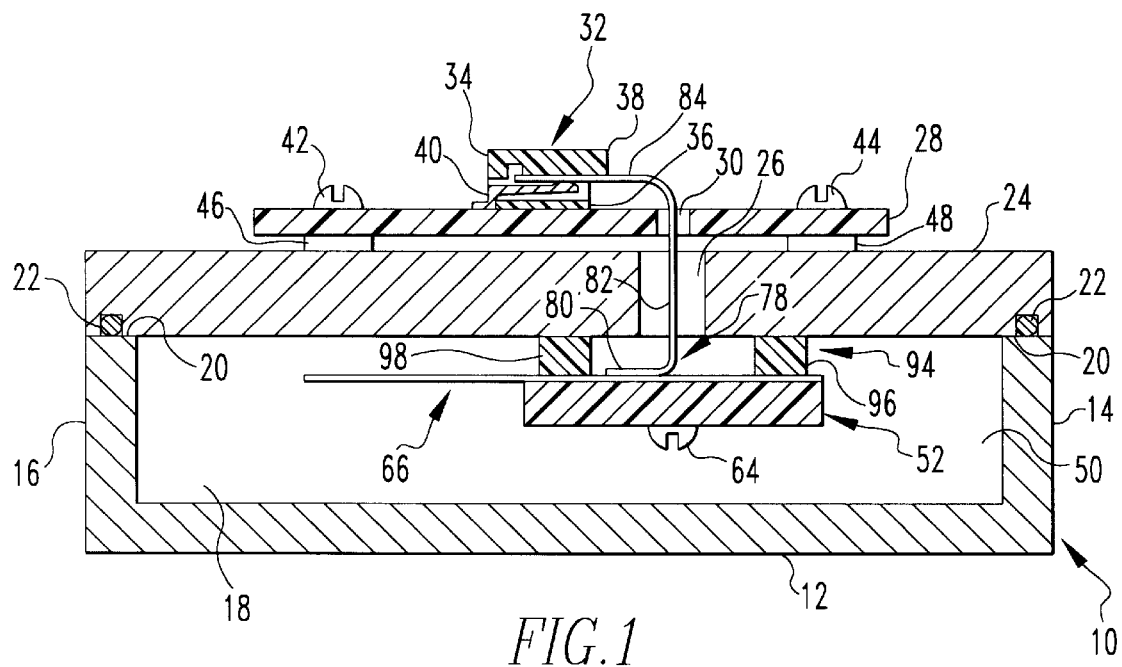
FIG. 1 is a longitudinal cross sectional view of an assembly representing a preferred embodiment of the present invention.
Figure 2:
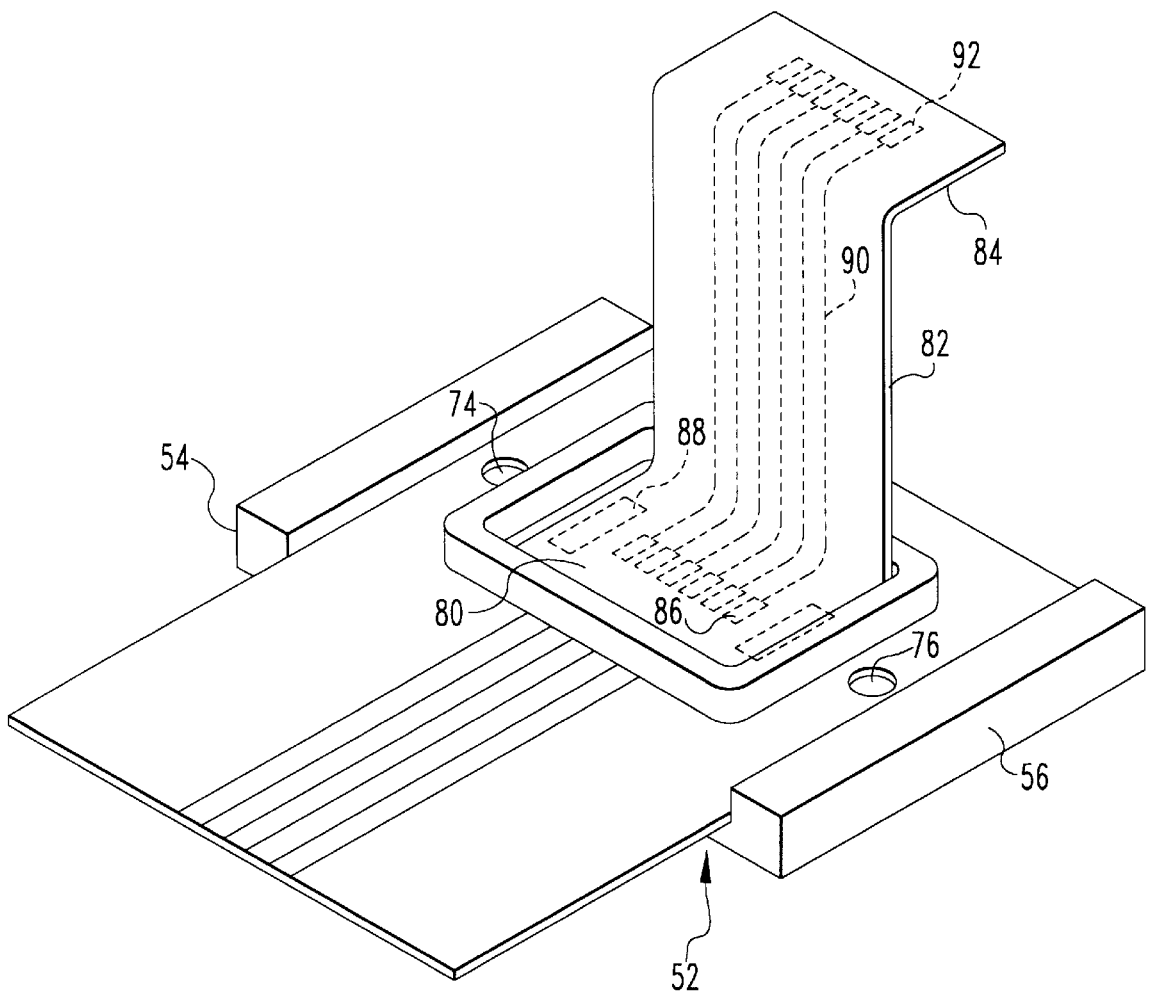
FIG. 2 is a perspective view of the flex circuits used in the assembly shown in FIG. 1 along with surrounding support and sealing components.
Figure 3:
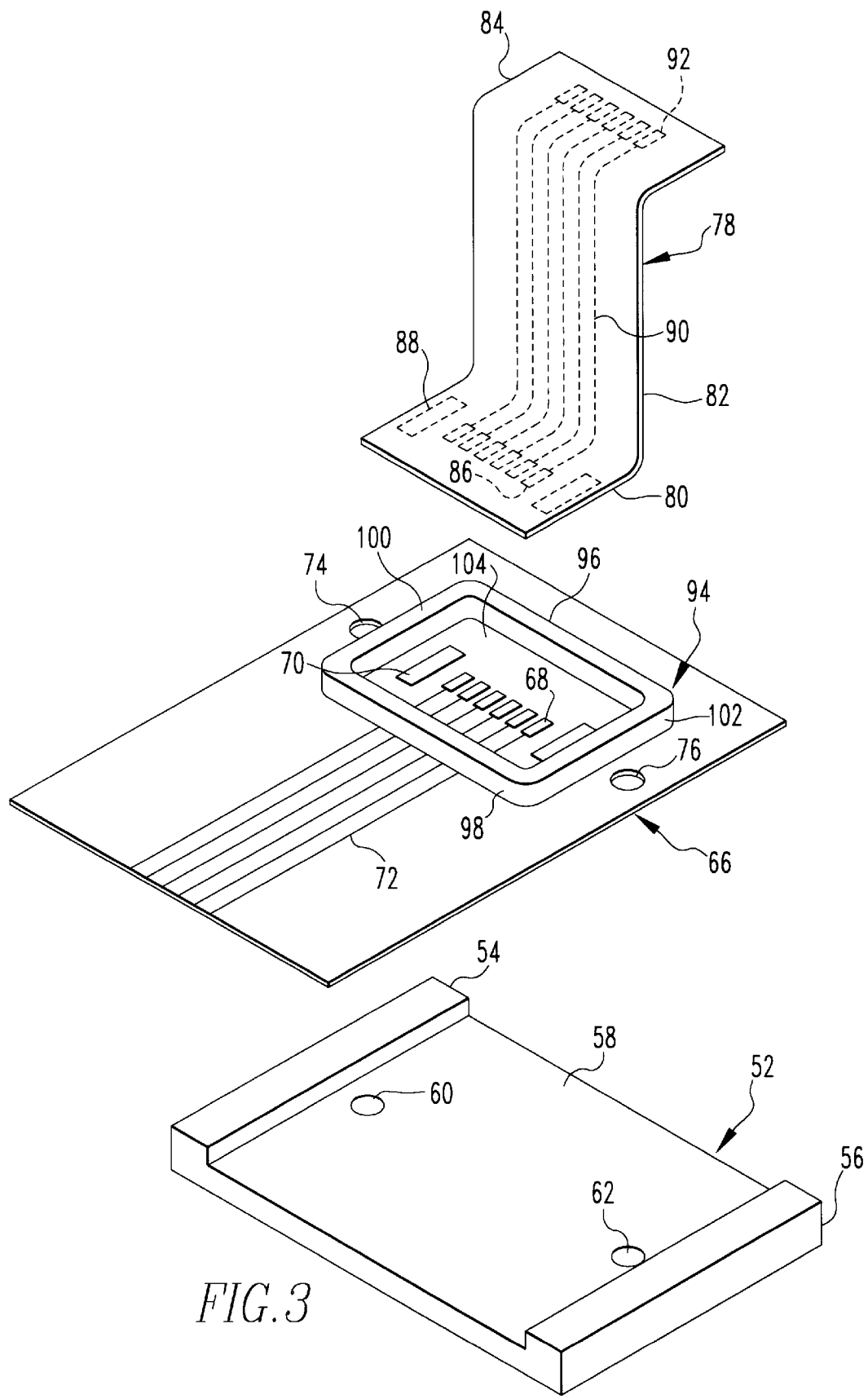
FIG. 3 is an exploded perspective view of the flex circuits and components shown in FIG. 2.

Referring to FIGS. 1–3, the assembly includes a concave plate shown generally at numeral 10 which is made up of a base wall 12 and a continuous peripheral wall which extend perpendicularly from the base wall and includes front wall 14, rear wall 16 and lateral walls as at lateral wall 18. This peripheral wall has an upper terminal edge 20 and a continuous seal 22 is positioned thereon. The assembly also includes a first substrate as at base plate 24 which is superimposed on the concave plate 10 so as to rest on the upper terminal edge 20 of the peripheral wall. The base plate 24 has a peripheral groove for accommodation of the continuous seal 22 which is interposed between the base plate and the peripheral wall on the cover plate 10. There is also a central transverse opening 26 in the base plate 12. A second substrate in the nature of a printed circuit board (PCB) 28 is positioned in parallel spaced relation to the base plate 24. The PCB 28 also has a central transverse opening 30 and an electrical connector shown generally at numeral 32 is mounted on its upper surface. The electrical connector 32 is comprised of an insulative housing having an upper wall 34 and a lower wall which rests directly on the PCB 28. A spacer member 38 has a solder tab (not shown) on its lower surface and is attached to the upper wall 34. Conductive terminal contacts 40 are interposed between the upper and lower walls of the connector. The PCB 28 is fastened to the base plate 24 by means of screws 42 and 44 and is spaced by means of spacers 46 and 48. Between the concave plate 10 and the base plate 24, there is a gas tight chamber 50. Inside the gas tight chamber there is a third substrate which is a stiffener plate 52. This stiffener plate has opposed side walls 54 and 56 and a flex circuit receiving reversed surface 58 which is interposed between the side walls. There are transverse apertures 60 and 62 through recessed surface 58, and stiffener plate 52 is attached by screws, as at screw 64, which pass through these apertures to the base plate 24. On the stiffener plate 52 there is a flex circuit 66, preferably extending in generally parallel relation between the first substrate 24 and concave plate 10, which has a plurality solder pads as at solder pads 68 and 70, and a plurality of conductive traces, such as trace 72. Also apertures 74 and 76 extend through the flex circuit for accommodation of fasteners as at screw 64 for mounting the flex circuit on the base plate 24. There is also a secondary flex circuit 78 which has a lower, preferably horizontal, section 80, an intermediate, preferably vertical, section 82 and an upper, preferably horizontal, section 84. On the lower section 80 there are a plurality of lower solder pads as at solder pad 86 and 88 which are connected to solder pads on the primary flex circuit 66 as at solder pad 68 and 70. As is conventional, the secondary flex circuit 78 also has a plurality of conductive traces as at trace 90 which conducts the lower solder pads to the upper solder pads as at upper solder pad 92 which is located on the upper section 84. The upper section 84 is interposed between the upper wall 34 and the lower wall 36 of connector 32 and in particular the solder pads as at solder pad 92 are fixed to spacer member 38 so that the conductive terminal contact as at contact 40 make electrical connections with conductive traces as at 90 on the secondary flex circuit. Surrounding the conjuncture of the primary and secondary flex circuit there is a gasket shown generally at 94 which has a front wall 96, a rear wall 98 and lateral walls 100 and 102. This gasket 94 forms a recess 104 which is exposed through opening 26 to the atomsphere which is separated from the gas tight chamber 50 between the concave plate 10 and the base plate 24.

Figure 4:
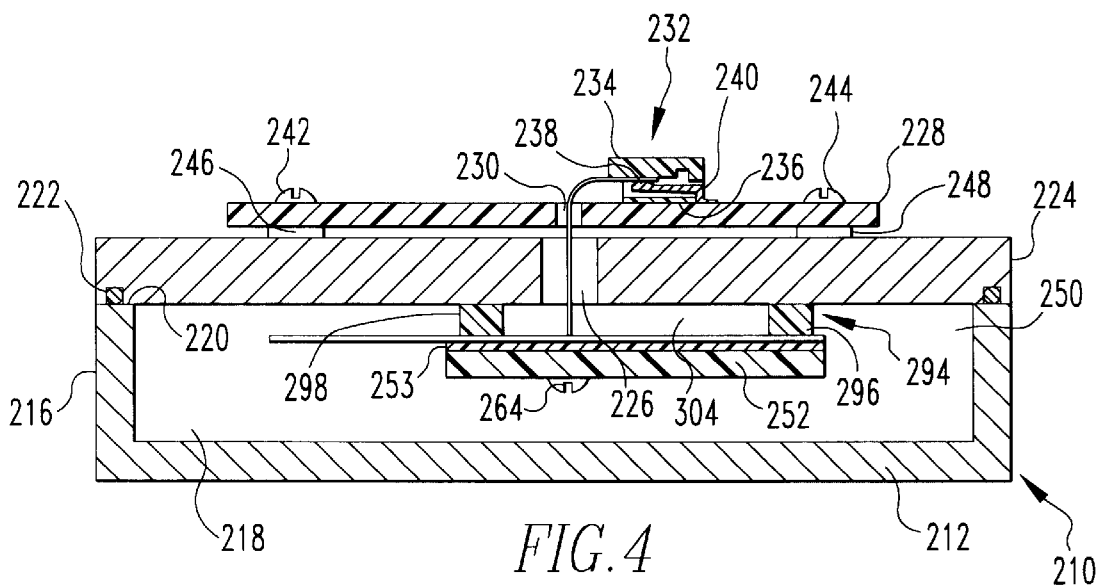
FIG. 4 is a longitudinal cross sectional view of an assembly representing an alternate preferred embodiment of the present invention.
Figure 5:
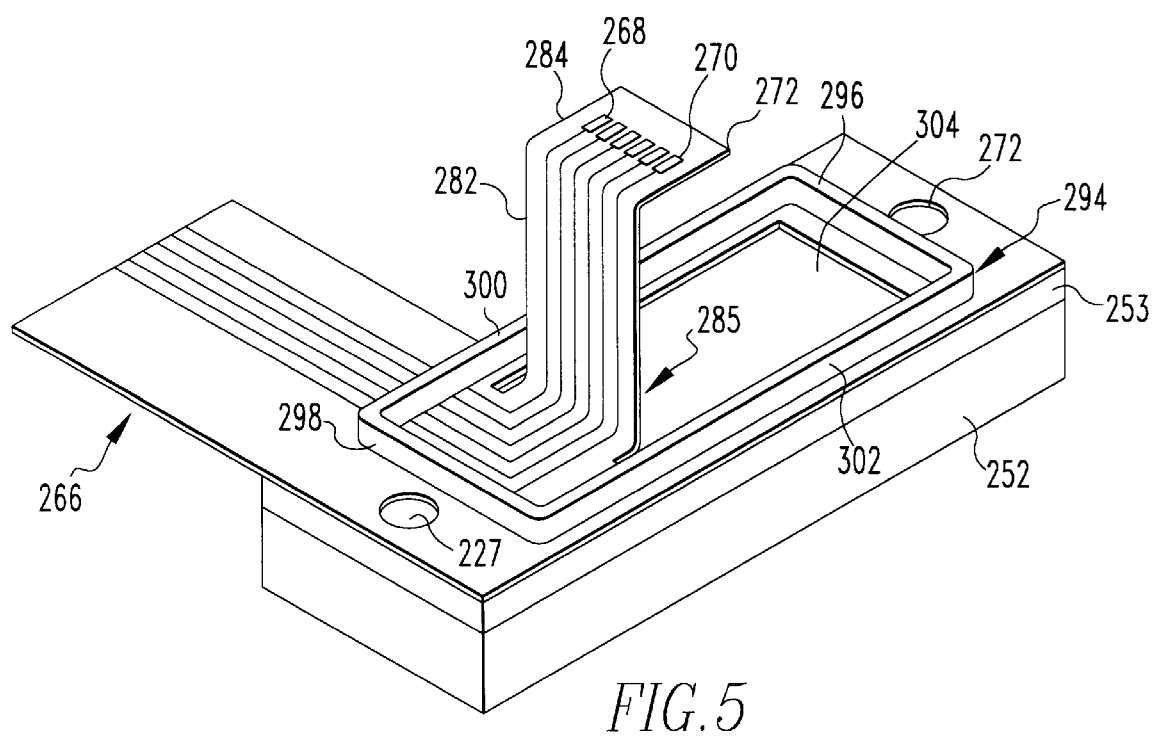
FIG. 5 is a perspective view of the flex circuit used the assembly shown in FIG. 4 along with surrounding support and sealing components.
Figure 6:
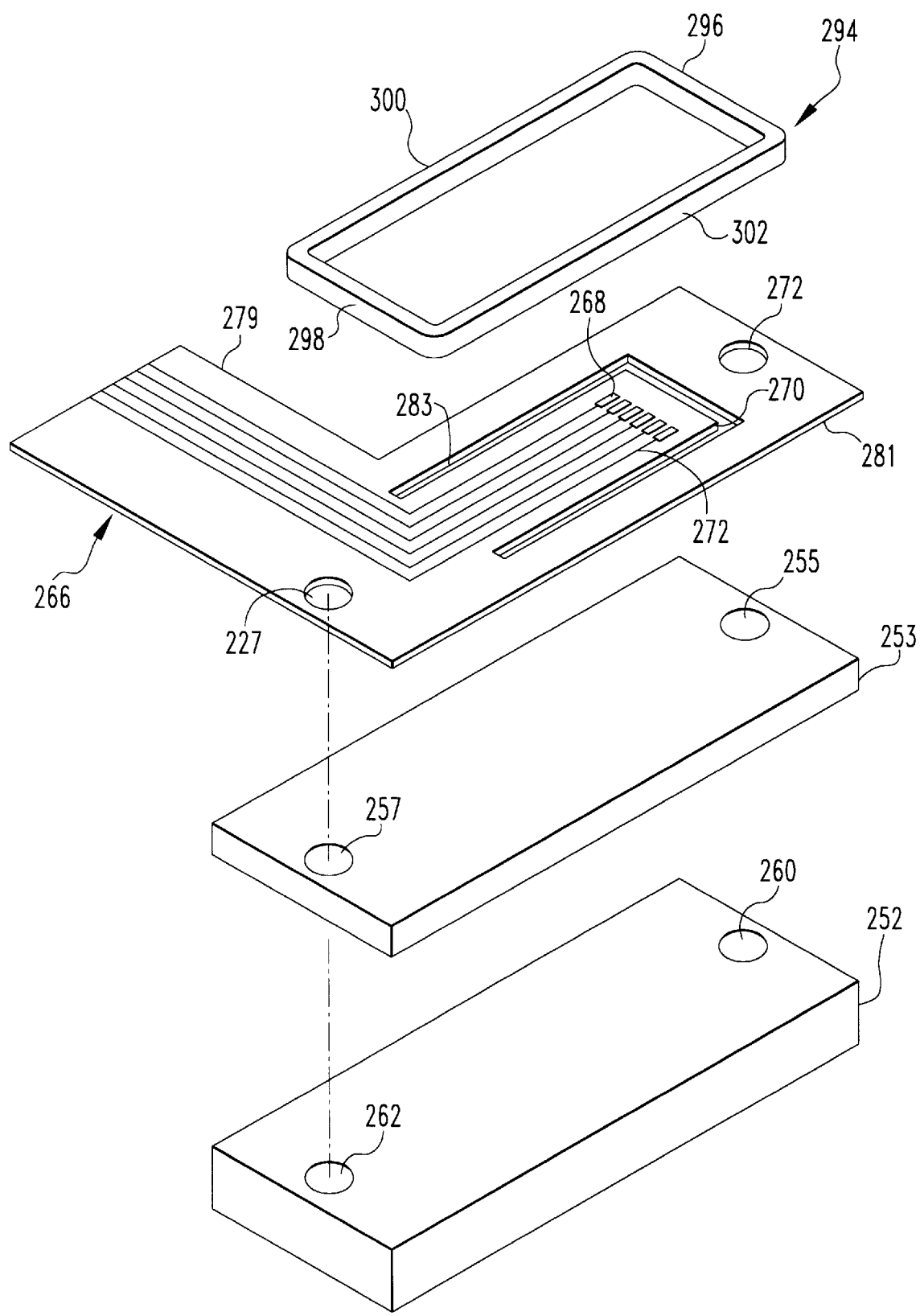
FIG. 6 is an exploded view of the flex circuit and the components shown in FIG. 5.

Referring to FIGS. 4–6, an alternate embodiment of the assembly includes a upper plate shown generally at numeral 210 which is made up of a base wall 212 and a continuous peripheral wall which extends perpendicularly from the base wall and includes front wall 214, rear wall 216 and lateral walls as at lateral wall 218. This peripheral wall has an upper terminal edge 220 with a continuous seal 222 positioned thereon. The assembly also includes a first substrate as at base plate 224 which is superimposed on the concave plate 210 so as to rest on the upper terminal edge 220 of the peripheral wall. The base plate 224 has a peripheral groove for accommodation of the continuous seal 222 which is interposed between the base plate and the peripheral wall on the cover plate 210. There is also a central transverse opening 226 in the base plate 212. A second substrate in the nature of a printed circuit board (PCB) 228 is positioned in parallel spaced relation to the base plate 224. The PCB 228 also has a central transverse opening 230 and an electrical connector shown generally at numeral 232 mounted on its upper surface. The electrical connector 232 is comprised of an insulative housing having an upper wall 234 and a lower wall 236 which rests directly on the PCB 228. A spacer member 238 has a solder tab (not shown) on its lower surface and is attached to the upper wall 234. Conductive contacts as at contact 240 are interposed between the upper and lower walls of the connector. The PCB 228 is fastened to the base plate 224 by means of screws 242 and 244 and is spaced from the base plate 224 by means of spacers 246 and 248. Between the concave plate 210 and the base plate 224, there is a gas tight chamber 250. Inside the gas tight chamber there is a third substrate which is a stiffener plate 252. Above the stiffener plate 252 there is a gasket 253 with transverse apertures 255 and 257. There are transverse apertures 260 and 262 through this stiffener plate 252 which is attached by screws as at screw 264 which pass through these apertures to the base plate 224. On the gasket 253 there is a flex circuit 266 which has a plurality solder pads as at solder pad 268 and 270 and a plurality of conductive traces as as base 272. Also apertures 274 and 276 extend through the flex circuit for accommodation of fasteners as at screw 264 for mounting the flex circuit on the base plate 224. The flex circuit 266 has a first leg 279 and a second leg 281. There is an extended slot 283 on the second leg 281 which forms a partially cut-out section 283, having an upwardly extending, preferably vertical section 282 that extends through openings 226 and 230 and then engages connector 232 in upper, preferably horizontal section 284. The upper section 284 is interposed between the upper wall 284 and the lower wall 236 of connector 232 and in particular the solder pads as at solder pad 292 are fixed to the upper member 238, so that the conductive terminal contacts as at contact 240 make electrical connections with conductive traces as at 272 on the secondary flex circuit. Surrounding the slot 283 there is a gasket shown generally at 294 which has a front wall 296, a rear wall 298 and lateral walls 300 and 302. This gasket 294 forms a recess 304 which is exposed through opening 226 to the atomsphere which is separated from the gas tight chamber 250 between the concave plate 210 and the base plate 224.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An assembly comprising:
    (a) a concave member;
    (b) a first substrate having a transverse opening and being superimposed over the concave member to form an internal chamber between said concave member and said first substrate;
    (c) a second substrate having a transverse opening and superimposed over said first substrate;
    (d) an electrical connector superimposed on the second substrate; and
    (e) a flexible circuit interposed in spaced relation between the first substrate and the concave member and extending through the transverse openings of the first and second substrates to engage the electrical connector.

2. The assembly of claim 1 wherein the second substrate is a printed circuit board (PCB).

3. The assembly of claim 2 wherein the electrical connector comprises a contact terminal connected to the PCB and an opposed retaining means and the flexible circuit is interposed between the retaining means and the contact.

4. The assembly of claim 1 wherein the internal chamber between the concave member and the first substrate is gas-tight.

5. The assembly of claim 4 wherein a stiffening surface is interposed between the concave member and the first substrate and the flexible circuit is superimposed on said stiffening surface between the stiffening surface and the first substrate.

6. The assembly of claim 5 wherein the stiffening surface is spaced from the first substrate in opposed relation to the transverse opening of the first substrate and there is a peripheral sealing means between the internal chamber and the transverse opening of the first substrate.

7. The assembly of claim 1 wherein the concave member is a cover plate having a planar base wall and a peripheral lateral wall having a terminal edge extending perpendicularly therefrom.

8. The assembly of claim 7 wherein the first substrate is a base plate positioned in spaced parallel relation to the base wall of the cover plate.

9. The assembly of claim 8 wherein the base plate rests on the terminal edge of the peripheral lateral wall.

10. The assembly of claim 9 wherein there is a peripheral sealing means between the base plate and the lateral wall of the cover plate.

11. An assembly comprising:
    (a) a concave member;
    (b) a first substrate having a transverse opening and being superimposed over the concave member to form an internal chamber between said concave member and said first substrate;
    (c) a second substrate having a transverse opening a superimposed over said first substrate;
    (d) an electrical connector means mounted on the second substrate;
    (e) a flexible circuit interposed in spaced generally parallel relation between the first substrate and the concave member; and
    (e) a second flexible circuit connected to the first flexible circuit and extending through the transverse openings of the first and second substrate to engage the electrical connector means.

12. The assembly of claim 11 wherein the second substrate is a printed circuit board (PCB).

13. The assembly of claim 12 wherein the electrical connector comprises a contact terminal connected to the PCB and an opposed retaining means and the flexible circuit is interposed between the retaining means and the contact.

14. The assembly of claim 11 wherein the internal chamber between the concave member and the first substrate is gas-tight.

15. The assembly of claim 14 wherein a stiffening surface is interposed between the concave member and the first substrate and the first flexible circuit is superimposed on said stiffening surface between the stiffening surface and the first substrate.

16. The assembly of claim 15 wherein the stiffening surface is spaced from the first substrate in opposed relation to the transverse opening of the first substrate and there is a peripheral sealing means between the internal chamber and the transverse opening of the first substrate.

17. The assembly of claim 11 wherein the concave member is a cover plate having a planar base wall and a peripheral lateral wall having a terminal edge extending perpendicularly therefrom.

18. The assembly of claim 17 wherein the first substrate is a base plate positioned in spaced parallel relation to the base wall of the cover plate.

19. The assembly of claim 18 wherein the base plate rests on the terminal edge of the peripheral lateral wall.

20. The assembly of claim 19 wherein there is a peripheral sealing means between the base plate and the lateral wall of the cover plate.

21. An assembly comprising:
  (a) a concave member;
  (b) a first substrate having a transverse opening and being superimposed over the concave member to form an internal chamber between said concave member and said first substrate;
  (c) a second substrate having a transverse opening and superimposed over said first substrate;
  (d) an electrical connector mounted on the second substrate; and
  (e) a flexible circuit carrying means having a first leg interposed in spaced relation between the first substrate and the concave member and a second leg extending through the transverse opening to engage the electrical connector means.

22. The assembly of claim 21 wherein the second substrate is a printed circuit board (PCB).

23. The assembly of claim 22 wherein the electrical connector comprises a contact terminal connected to the PCB and an opposed retaining means and the flexible circuit is interposed between the retaining means and the contact.

24. The assembly of claim 21 wherein the internal chamber between the concave member and the first substrate is gas-tight.

25. The assembly of claim 24 wherein a stiffening surface is interposed between the concave member and the first substrate and the flexible circuit is superimposed on said stiffening surface between the stiffening surface and the first substrate.

26. The assembly of claim 25 wherein the stiffening surface is spaced from the first substrate in opposed relation to the transverse opening of the first substrate and there is a peripheral sealing means between the internal chamber and the transverse opening of the first substrate.

27. The assembly of claim 21 wherein the concave member is a cover plate having a planar base wall and a peripheral lateral wall having a terminal edge extending perpendicularly therefrom.

28. The assembly of claim 27 wherein the first substrate is a base plate positioned in spaced parallel relation to the base wall of the cover plate.

29. The assembly of claim 28 wherein the base plate rests on the terminal edge of the peripheral lateral wall.

30. The assembly of claim 29 wherein there is a peripheral sealing means between the base plate and the lateral wall of the cover plate.

* * * * *